United States Patent
Carobolante et al.

(10) Patent No.: US 10,115,835 B2
(45) Date of Patent: Oct. 30, 2018

(54) VARIABLE CAPACITOR BASED ON BURIED OXIDE PROCESS

(71) Applicant: QUALCOMM Incorporated, San Diego, CA (US)

(72) Inventors: Francesco Carobolante, San Diego, CA (US); Fabio Alessio Marino, San Marcos, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/250,493

(22) Filed: Aug. 29, 2016

(65) Prior Publication Data
US 2018/0062001 A1    Mar. 1, 2018

(51) Int. Cl.
| | |
|---|---|
| *H01L 29/93* | (2006.01) |
| *H01L 23/00* | (2006.01) |
| *H01L 29/06* | (2006.01) |
| *H01L 29/66* | (2006.01) |
| *H01L 27/08* | (2006.01) |

(52) U.S. Cl.
CPC ............ *H01L 29/93* (2013.01); *H01L 24/08* (2013.01); *H01L 29/0649* (2013.01); *H01L 29/66174* (2013.01); *H01L 29/66189* (2013.01); *H01L 27/0808* (2013.01)

(58) Field of Classification Search
CPC .... H01L 29/93; H01L 29/94; H01L 29/66174
See application file for complete search history.

(56) References Cited

U.S. PATENT DOCUMENTS

| | | | |
|---|---|---|---|
| 6,835,977 B2 | 12/2004 | Gan et al. | |
| 6,864,528 B2 | 3/2005 | Maget | |
| 8,013,379 B2 | 9/2011 | Futatsugi | |
| 8,498,094 B2 | 7/2013 | Marino et al. | |
| 8,803,288 B1 | 8/2014 | Marino et al. | |
| 8,963,289 B2 | 2/2015 | Marino et al. | |
| 9,214,512 B2 | 12/2015 | Marino et al. | |

(Continued)

OTHER PUBLICATIONS

International Search Report and Written Opinion—PCT/US2017/044916—ISA/EPO—dated Jan. 4, 2018.

(Continued)

*Primary Examiner* — Tucker J Wright
(74) *Attorney, Agent, or Firm* — Patterson & Sheridan, L.L.P.

(57) ABSTRACT

Certain aspects of the present disclosure provide a semiconductor variable capacitor based on a buried oxide process. The semiconductor variable capacitor generally includes a first conductive pad coupled to a first non-insulative region and a second conductive pad coupled to a second non-insulative region. The second non-insulative region may be coupled to a semiconductor region. The capacitor may also include a first control region coupled to the first semiconductor region such that a capacitance between the first conductive pad and the second conductive pad is configured to be adjusted by varying a control voltage applied to the first control region. The capacitor also includes an insulator region disposed below the semiconductor region, wherein at least a portion of the first non-insulative region is separated from the second non-insulative region by the insulator region such that the first conductive pad is electrically isolated from the second conductive pad.

18 Claims, 14 Drawing Sheets

(56) References Cited

U.S. PATENT DOCUMENTS

2010/0155897 A1    6/2010  Collins et al.
2014/0232451 A1    8/2014  Dutta
2014/0367832 A1*  12/2014  Marino ............... H01L 29/0615
                                                    257/597
2015/0194538 A1    7/2015  Marino et al.

OTHER PUBLICATIONS

Partial International Search Report—PCT/US2017/044916—ISA/EPO—dated Nov. 2, 2017.

* cited by examiner

VARIABLE CAPACITOR BASED ON BURIED OXIDE PROCESS

TECHNICAL FIELD

Certain aspects of the present disclosure generally relate to electronic circuits and, more particularly, to a variable capacitor.

BACKGROUND

Semiconductor capacitors are fundamental components for integrated circuits. A variable capacitor is a capacitor whose capacitance may be intentionally and repeatedly changed under the influence of a bias voltage. A variable capacitor, which may be referred to as a varactor, is often used in inductor-capacitor (LC) circuits to set the resonance frequency of an oscillator, or as a variable reactance, e.g., for impedance matching in antenna tuners.

A voltage-controlled oscillator (VCO) is an example circuit that may use a varactor in which the thickness of a depletion region formed in a p-n junction diode is varied by changing a bias voltage to alter the junction capacitance. Any junction diode exhibits this effect (including p-n junctions in transistors), but devices used as variable capacitance diodes are designed with a large junction area and a doping profile specifically chosen to improve the device performance, such as quality factor and tuning range.

SUMMARY

Certain aspects of the present disclosure generally relate to a variable capacitor implemented using a buried oxide layer.

Certain aspects of the present disclosure provide a semiconductor variable capacitor. The semiconductor variable capacitor generally includes a first conductive pad coupled to a first non-insulative region, a second conductive pad coupled to a second non-insulative region, wherein the second non-insulative region is coupled to a first semiconductor region, a first control region coupled to the first semiconductor region such that a capacitance between the first conductive pad and the second conductive pad is configured to be adjusted by varying a control voltage applied to the first control region, and a first insulator region disposed below the first semiconductor region, wherein at least a portion of the first non-insulative region is separated from the second non-insulative region by the first insulator region such that the first conductive pad is electrically isolated from the second conductive pad.

Certain aspects of the present disclosure provide a semiconductor variable capacitor. The semiconductor variable capacitor generally includes a first conductive pad coupled to a first non-insulative region, a second conductive pad coupled to a second non-insulative region, wherein the second non-insulative region is coupled to a first semiconductor region, a first control region and a second control region, wherein a capacitance between the first conductive pad and the second conductive pad is configured to be adjusted by varying one or more control voltages applied to the first control region and the second control region, wherein the first control region is coupled to the first semiconductor region, and a first insulator region disposed below the first semiconductor region, wherein the second control region is separated from the second non-insulative region by the first insulator region.

Certain aspects of the present disclosure provide a method for fabricating a semiconductor variable capacitor. The method generally includes forming a first insulator region, forming a first semiconductor region above the first insulator region, forming a first non-insulative region, coupling a first conductive pad to the first non-insulative region, forming a second non-insulative region coupled to the first semiconductor region formed above the first insulator region, coupling a second conductive pad to the second non-insulative region, wherein at least a portion of the first non-insulative region is separated from the second non-insulative region by the first insulator region such that the first conductive pad is electrically isolated from the second conductive pad, and forming a first control region coupled to the first semiconductor region such that a control voltage applied to the first control region is configured to adjust a capacitance between the first conductive pad and the second conductive pad.

Certain aspects of the present disclosure provide a method for fabricating a semiconductor variable capacitor. The method generally includes forming an insulator region, forming a semiconductor region above the insulator region, forming a first non-insulative region, coupling a first conductive pad to the first non-insulative region, forming a second non-insulative region, coupling a second conductive pad to the second non-insulative region, wherein the second non-insulative region is coupled to the semiconductor region, forming a first control region coupled to the semiconductor region, and forming a second control region, wherein the second control region is separated from the second non-insulative region by the insulator region such that one or more control voltages applied to the first control region and the second control region are configured to adjust a capacitance between the first conductive pad and the second conductive pad.

BRIEF DESCRIPTION OF THE DRAWINGS

So that the manner in which the above-recited features of the present disclosure can be understood in detail, a more particular description, briefly summarized above, may be by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

DETAILED DESCRIPTION

Aspects of the present disclosure are generally directed to a semiconductor variable capacitor structure, also referred to as a "transcap," suitable for integrated circuits. A transcap device may have at least three terminals, where the capacitance between two main terminals of the device (C1 and C2) can be varied by changing a bias voltage applied between a control terminal CTRL and one of the other two main terminals (e.g., C2). Aspects of the present disclosure are generally directed to increasing a voltage rating of the transcap device by using a buried insulator region (e.g., buried oxide layer) of the semiconductor to isolate the main terminals C1 and C2 from each other. In some cases, using the buried insulator region to isolate the main terminals C1 and C2 can also improve the linearity of the transcap device.

The word "exemplary" is used herein to mean "serving as an example, instance, or illustration." Any aspect described herein as "exemplary" is not necessarily to be construed as preferred or advantageous over other aspects.

As used herein, the term "connected with" in the various tenses of the verb "connect" may mean that element A is directly connected to element B or that other elements may be connected between elements A and B (i.e., that element A is indirectly connected with element B). In the case of electrical components, the term "connected with" may also be used herein to mean that a wire, trace, or other electrically conductive material is used to electrically connect elements A and B (and any components electrically connected therebetween).

Figure 1:
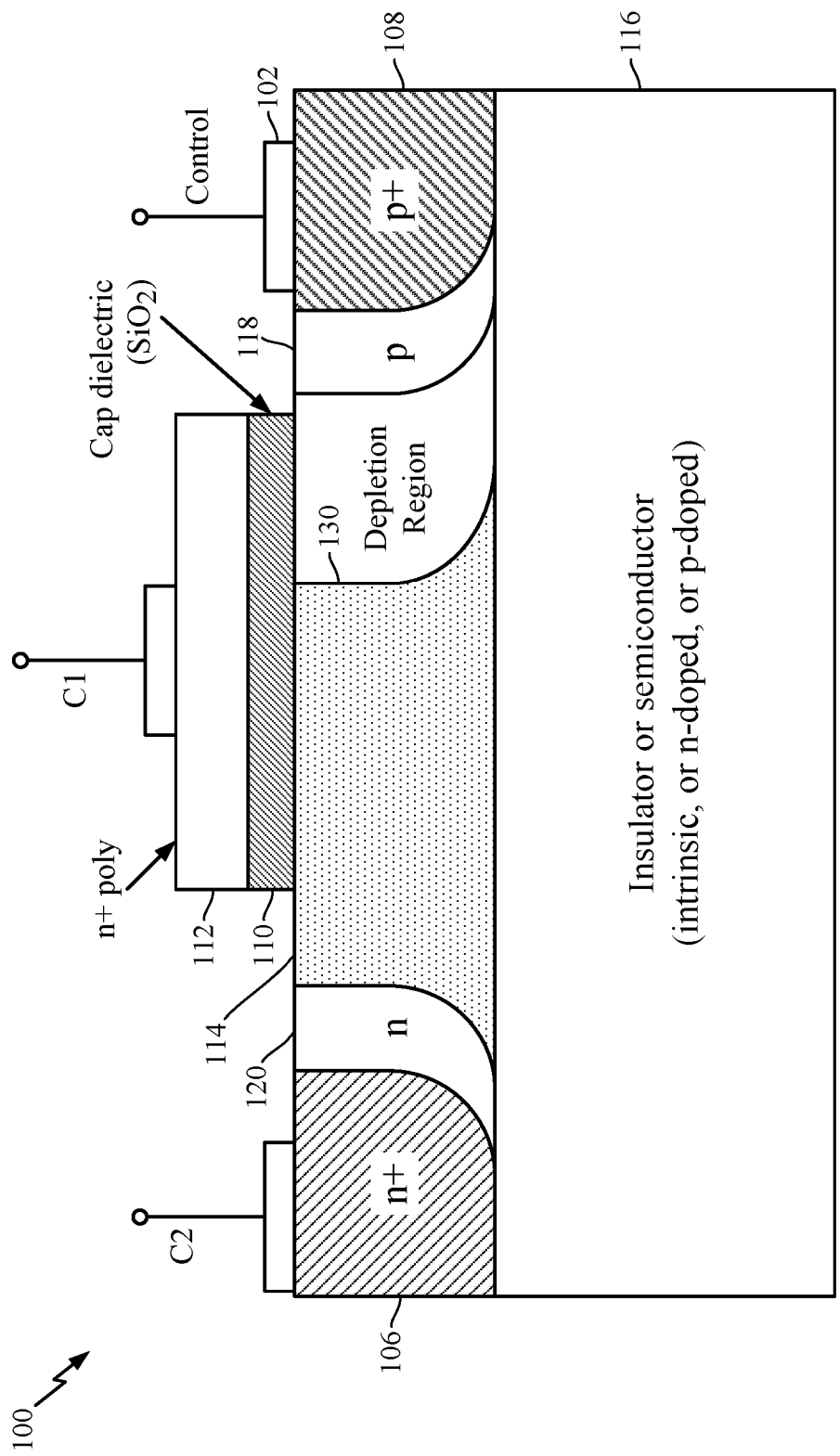
FIG. 1 illustrates an example semiconductor variable capacitor.

FIG. 1 illustrates an example structure of a transcap device 100. Certain implementations of a transcap device use an oxide layer 110, which may be used to fabricate metal-oxide semiconductor (MOS) devices (e.g., thin or thick gate oxide). The oxide layer 110 may isolate the C1 and C2 terminals, and thus, in effect act as a dielectric for the transcap device 100. A non-insulative region 106 (e.g., n+ implantation region) and a non-insulative region 108 (e.g., p+ implantation region) may be formed on the two sides of the transcap device 100 in order to create p-n junctions. As used herein, a non-insulative region generally refers to a region that may be conductive or semiconductive. A bias voltage may be applied between the control terminal 102 and the C2 terminal in order to modulate the capacitance between terminals C1 and C2. For example, by applying a bias voltage to the control terminal 102, a depletion region 130 may be formed between the p-n junction of non-insulative region 108 (e.g., control region) and the semiconductor region 114. Based on the bias voltage, this depletion region 130 may widen under the oxide layer 110, reducing the area of the equivalent electrode formed by the semiconductor region 114, and with it, the effective capacitance area and capacitance value of the transcap device 100.

The work-function of a non-insulative region 112 above the oxide layer 110 may be chosen to improve the device performance. For example, an n-doped poly-silicon material may be used (instead of a p-doped), even if the semiconductor region 114 underneath the oxide layer 110 is doped with n-type impurities. In some aspects, a metallic material (also doped if desired) may be used for the non-insulative region 112 with an opportune work-function or a multi-layer stack of different metallic materials so as to obtain the desired work-function. The certain aspects, non-insulative region 112 may be divided into two sub-regions, one n-doped and one p-doped, or a different metallic material may be used for each sub-region.

In some cases, the semiconductor region 114 may be disposed above an insulator or semiconductor region 116. The region 116 may be chosen in order to improve the transcap device 100 performance. For example, the region 116 may be an insulator, a semi-insulator or an intrinsic/near-intrinsic semiconductor in order to decrease the parasitic capacitances associated with the substrate (not shown). In some cases, the region 116 can be made of n-doped or p-doped semiconductor with an appropriate doping profile in order to increase the transcap device quality factor and/or the control on the depletion region 130 that may be formed between the non-insulative region 108 and the semiconductor region 114 when applying a bias voltage to the control terminal 102. The region 116 can also formed by multiple semiconductor layers or regions doped in different ways (n, p or intrinsic). Furthermore, the region 116 can include semiconductors, insulating layers, and/or substrates or can be formed above semiconductors, insulating layers, and/or substrates.

To better understand the working principle of the transcap device 100, it may be assumed that the control terminal 102 is biased with a negative voltage with respect to the C2 terminal. The width of the depletion region 130 in the semiconductor region 114 may be controlled by applying a control voltage to the control terminal 102. The capacitance between the C1 and C2 terminals may depend on the depletion region 130 in the semiconductor region 114, and thus, can be controlled by applying the control voltage to the control terminal 102. Furthermore, the variation of the bias voltage applied to the control terminal 102 may not alter the DC voltage between the C1 and C2 terminals, allowing for improved control of the device characteristics.

In some cases, it may be preferable to have the non-insulative region 106 and/or non-insulative region 108 a distance away from the oxide layer 110 in order to reduce the parasitic capacitance associated with the non-insulative region 108 and improve the isolation of the non-insulative region 106 for high control voltages. For example, the non-insulative region 106 can be partially overlapped with the oxide layer 110, or the non-insulative region 106 can be formed at a distance from the edge of the oxide layer 110 so as to increase the device tuning range and linearity. In the latter case, the voltage-withstanding capability of the device is improved since a portion of a radio-frequency (RF) signal, that may be applied to the C1 and C2 terminals, drops between the oxide edge and the non-insulative region 106 instead of being applied entirely across the oxide layer 110. The non-insulative region 108 can be partially overlapped with the oxide layer 110, or the non-insulative region 108 can be spaced apart so as to reduce the parasitic capacitance between the C1 terminal and the control terminal 102.

A p-doped region 118 can be optionally used to improve the breakdown voltage of the p-n junction between non-insulative region 108 and semiconductor region 114, decreasing, at the same time, the parasitic capacitance between the C1 terminal and the control terminal 102. Similarly, an optional n-doped region 120 can be added between the non-insulative region 106 and semiconductor region 114 in order to regulate the doping concentration between the oxide layer 110 and the non-insulative region 106.

Figure 2:
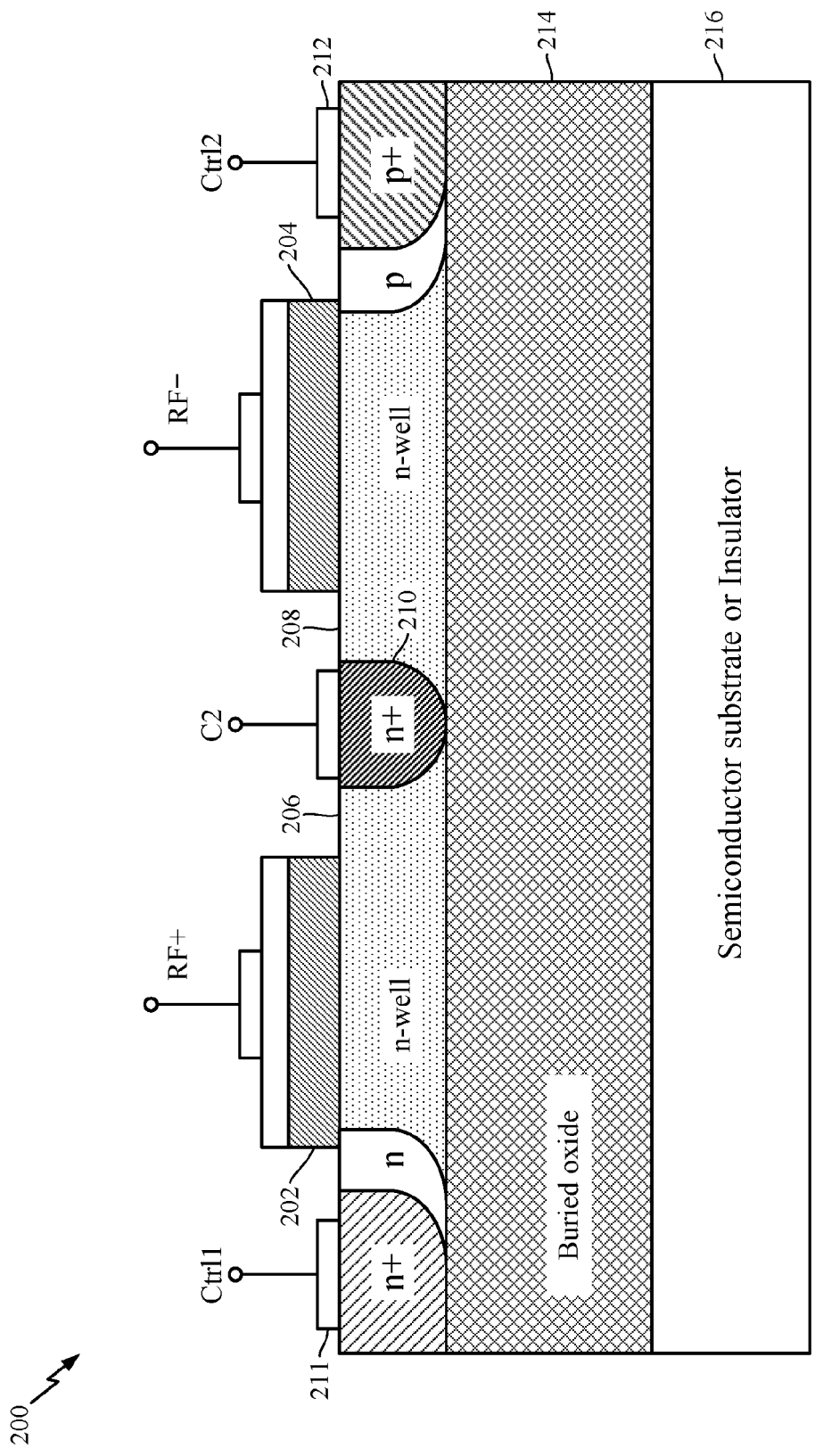
FIG. 2 illustrates an example differential semiconductor variable capacitor.

FIG. 2 illustrates an example differential transcap device 200. The differential transcap device 200 can be obtained by disposing two of the transcap devices 100 back-to-back. In this example, RF+ and RF− terminals (e.g., corresponding to the C1 terminal in FIG. 1) correspond to the positive and negative nodes of a differential RF port providing a differential RF signal. The RF+ terminal may be disposed on an oxide layer 202, and an RF− terminal may be disposed on an oxide layer 204. N-well regions 206 and 208 may be coupled to a C2 terminal via a non-insulative region 210 (e.g., n+), as illustrated. A bias voltage may be applied to the control terminals 211 and 212 (or to the C2 terminal with respect to the other terminals of the device) to adjust a depletion region of the n-well regions 206 and 208, respectively, thereby adjusting the capacitance between respective RF+ and RF− terminals and the C2 terminal. In some aspects, a buried oxide layer 214 may be positioned below the n-well regions 206 and 208 and above a semiconductor substrate or insulator 216, as illustrated.

The primary problem with the above implementations of a transcap device is the difficulty in obtaining high voltage rating for the transcap structure, due to the thinness of the gate oxide (e.g., oxide layer 110, oxide layer 202, and/or oxide layer 204). This is especially true in advanced process nodes where MOS transistors are manufactured with thin oxides and are operated with lower voltages to achieve higher density and faster speeds. For example, traditional oxide thicknesses may withstand 5 volts, but progressively newer technology nodes have reduced such rating to 3.3 volts, 2.5 volts, 1.8 volts, or even as low as 1.2 volts. To overcome the reduced voltage rating due to the thinness of the gate oxide, multiple capacitors may be placed in series to withstand higher voltages. However, each additional series capacitor causes the silicon area consumed by the transcap device to increase for the same capacitance value, thus quickly making the solution not cost effective.

Thus, what is needed is a transcap device with increased voltage rating. Aspects of the present disclosure implement a capacitor across a buried oxide of the semiconductor, which can withstand higher voltages as compared to the gate oxide. For example, the buried oxide may be able to withstand 10 volts or higher in some case, thus providing increased voltage rating for a transcap device structure as compared to using a gate oxide.

Figure 3:
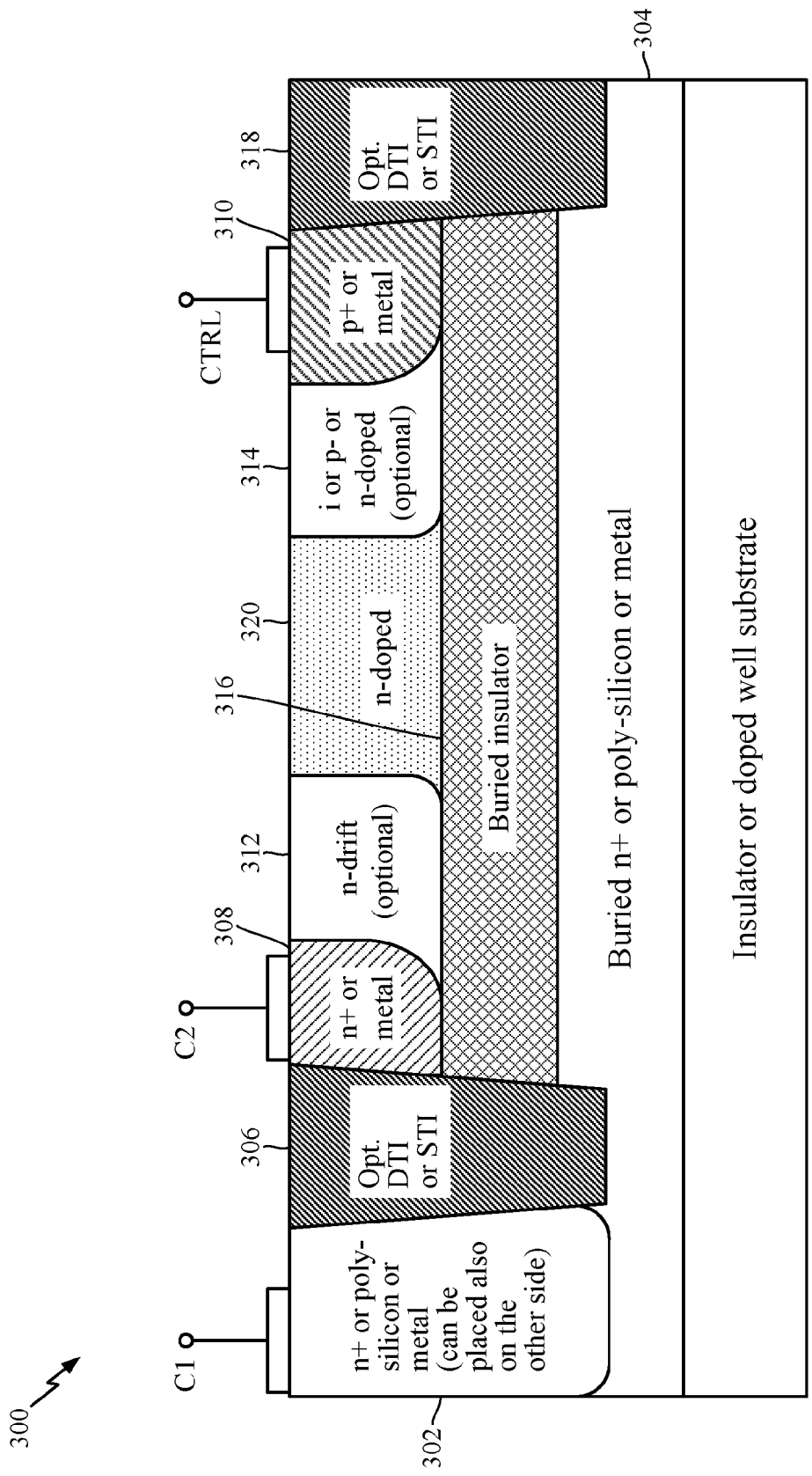
FIG. 3 illustrates an example semiconductor variable capacitor using a buried insulator for isolation, in accordance with certain aspects of the present disclosure.

FIG. 3 illustrates an example transcap device 300 using a buried insulator 316 (e.g., buried oxide layer) for isolation, in accordance with certain aspects of the present disclosure.

The buried insulator 316 in effect acts as the dielectric for the transcap device 300. The C1 terminal may be coupled to a non-insulative region 302 (e.g., sink implantation), which in turn may be coupled to a non-insulative region 304. The non-insulative regions 302 and 304 may be implemented using doped silicon (e.g., n+), poly-silicon, or metal. The non-insulative region 304 may be isolated from the non-insulative region 308 and the non-insulative region 310 by the buried insulator 316. The non-insulative regions 308 and 310 may be coupled to a semiconductor region 320. The non-insulative region 302 may be placed on either side of the structure of the transcap device 300. For example, the C1 terminal and the non-insulative region 302 may be coupled to the trench isolation region 318 and coupled to the non-insulative region 304.

In some cases, the isolation region between the non-insulative region 302 and the non-insulative region 308 can be obtained with a deep trench isolation (DTI) 306. In certain aspects, the transcap device 300 can be implemented using as a circular or polygonal design, with one of the C1 or C2 terminals at the center of the circle. In this case, adjacent cells can be isolated by a p-substrate and/or p-well. For a complete isolation, the wafer can be back-ground to the DTI or to the buried implantation. Moreover, additional doped or intrinsic regions 312 and 314 can be optionally added between the C2 terminal and the non-insulative region 310 coupled to the control terminal.

As presented above, the non-insulative region 302 coupled to the C1 terminal may be placed on another side of the transcap device 300. For example, the non-insulative region 302 may be placed on the other side of the non-insulative region 310 and isolated from the non-insulative region 310 by the DTI (or shallow trench isolation (STI)) 318.

Figure 4:
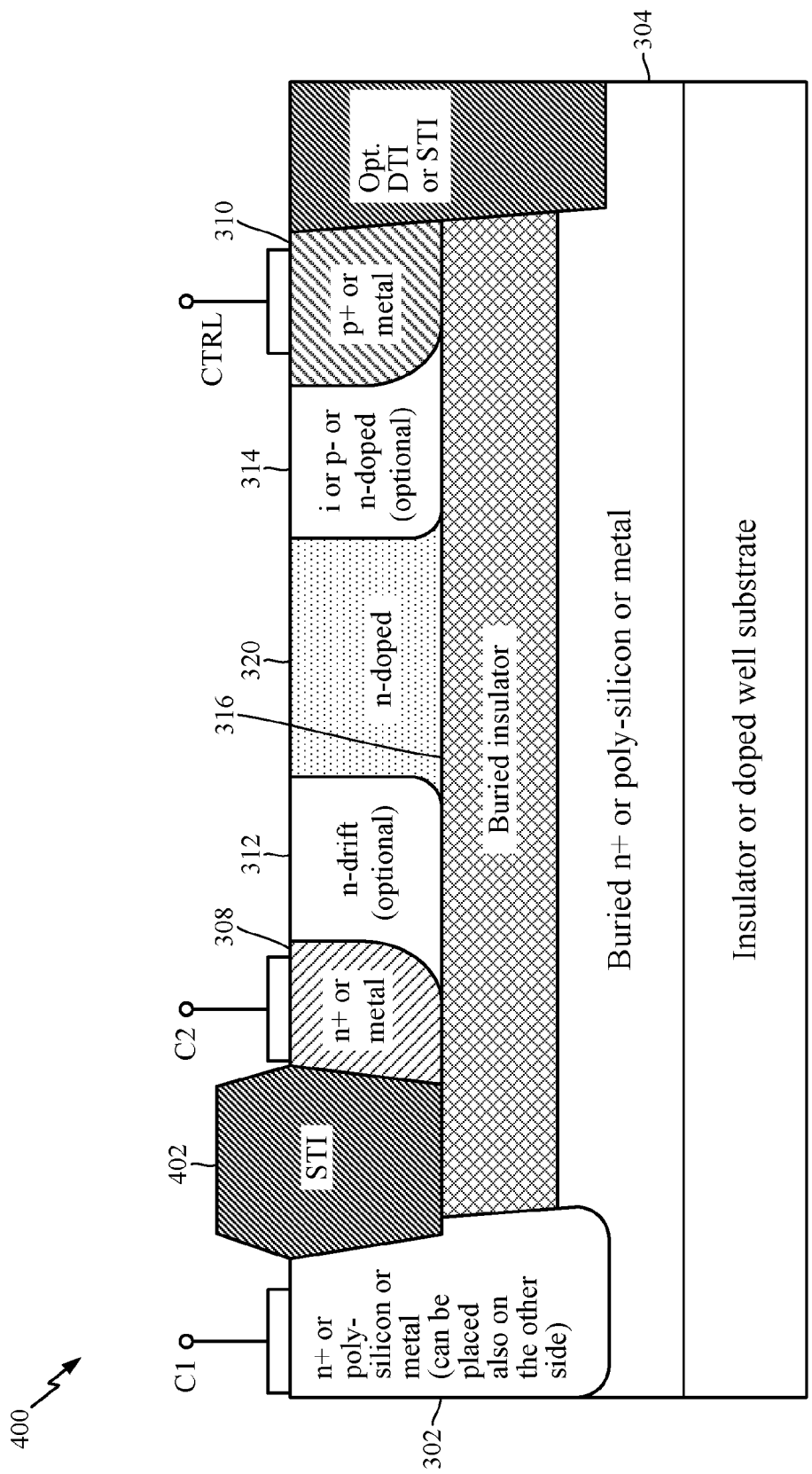
FIG. 4 illustrates an example semiconductor variable capacitor using a buried insulator for isolation and implemented using shallow trench isolation (STI), in accordance with certain aspects of the present disclosure.

FIG. 4 illustrates an example transcap device 400 using a buried insulator 316 for isolation and implemented using STI, in accordance with certain aspects of the present disclosure. That is, the non-insulative region 302 coupled to the C1 terminal may be isolated from the non-insulative region 308 coupled to the C2 terminal via a STI 402, as opposed to a DTI 306 as illustrated in FIG. 3. In this case, the buried insulator 316 may extend to the non-insulative region 302.

Figure 5:
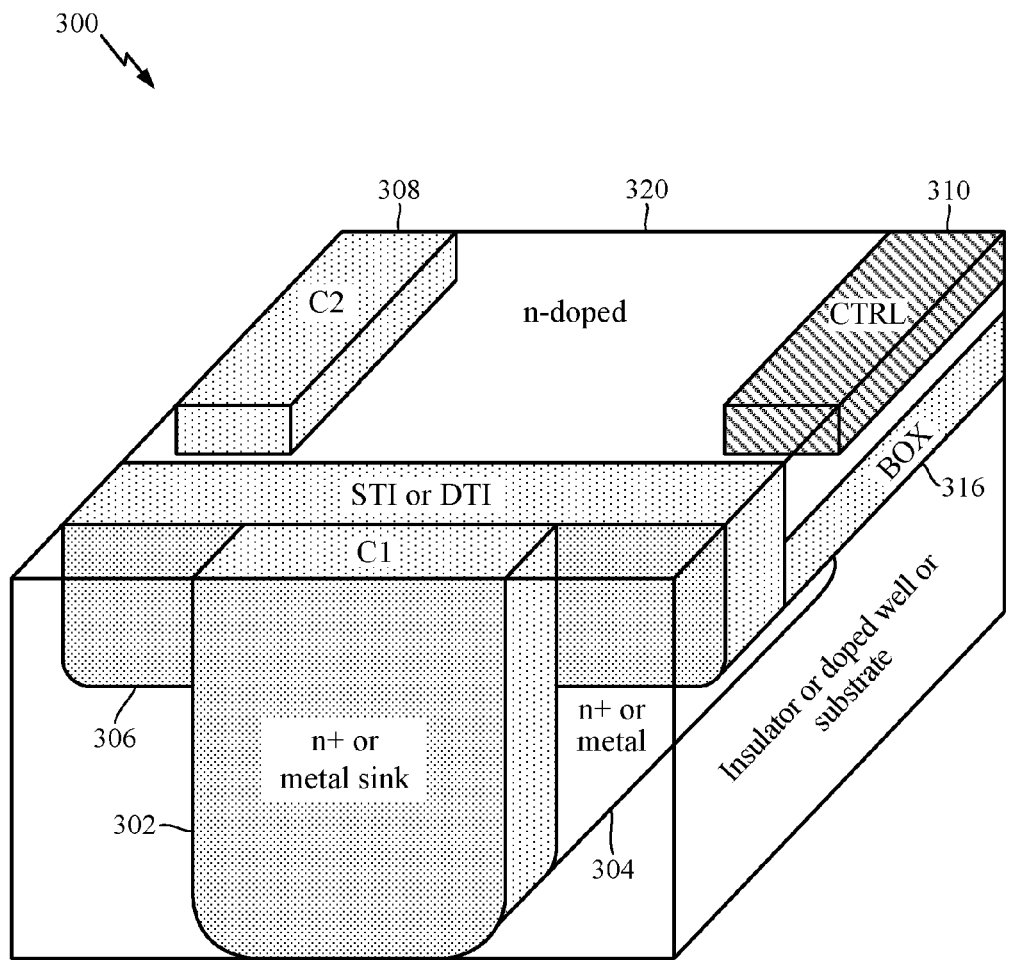
FIG. 5 is a three-dimensional (3D) view of an example semiconductor variable capacitor, in accordance with certain aspects of the present disclosure.

FIG. 5 is a three-dimensional (3D) view of the example transcap device 300, in accordance with certain aspects of the present disclosure. In order to decrease the parasitic capacitance between the non-insulative region 310 and the C1 terminal and/or between the C2 terminal and the non-insulative region 304, the non-insulative region 302 (e.g., sink region) can be placed in the direction perpendicular to the cross section of FIG. 3. As illustrated, the non-insulative region 304 extends from the non-insulative region 302 beneath the buried insulator 316 and towards the C2 and control terminals.

Figure 6:
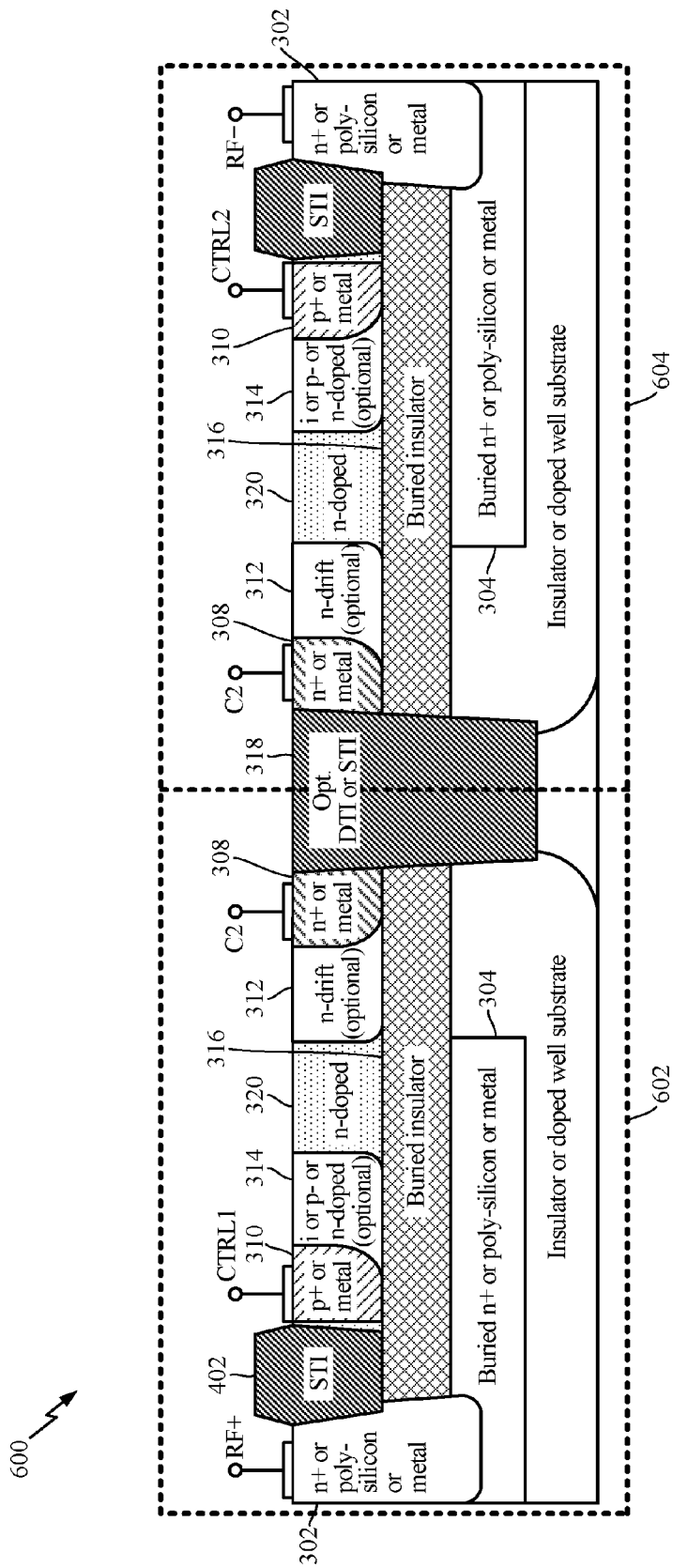
FIG. 6 illustrates an example differential semiconductor variable capacitor using a buried insulator for isolation, in accordance with certain aspects of the present disclosure.

FIG. 6 illustrates an example implementation of a differential transcap device 600 using a buried insulator 316 for isolation, in accordance with certain aspects of the present disclosure. The transcap device 600 can be obtained by connecting two transcap devices 602 and 604 back-to-back. In certain aspects, the C2 terminals of each of the transcap devices 602 and 604 may be shorted, and a differential signal may be applied to the respective C1 terminals annotated as RF+ and RF− in FIG. 6. In this case, the non-insulative region 310 coupled to the control terminal is disposed on the side closer to the non-insulative region 302. In certain aspects, the non-insulative regions 308 of the transcap devices 602 and 604 may be merged into a single region by removing the central trench isolation region 318.

Figure 7:
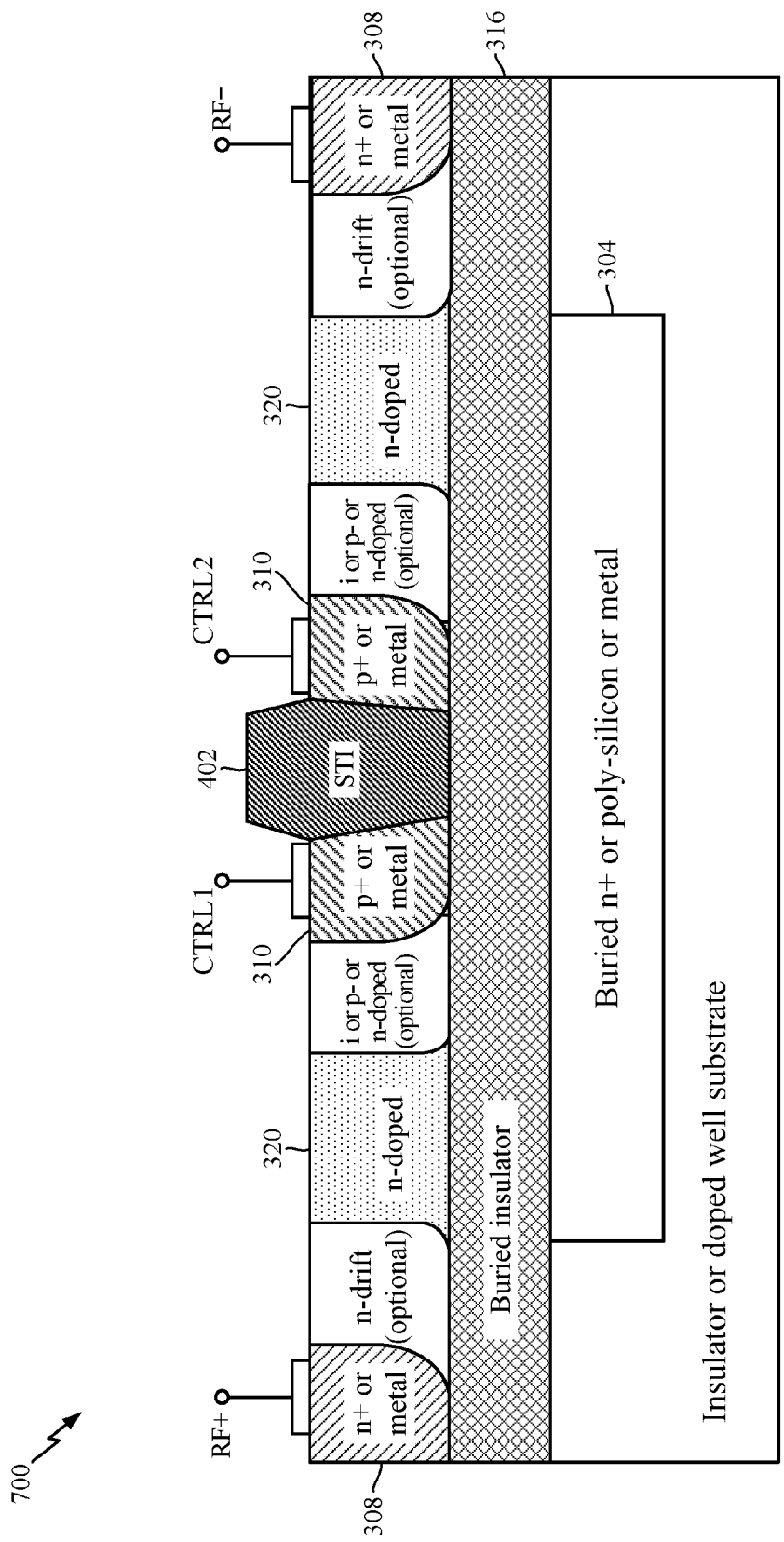
FIG. 7 illustrates an example differential semiconductor variable capacitor with shorted control terminals, in accordance with certain aspects of the present disclosure.

FIG. 7 illustrates an example differential transcap device 700 using a buried insulator 316 for isolation, in accordance with certain aspects of the present disclosure. In certain aspects, the two non-insulative regions 310 coupled to the control terminals may be different regions and separated via trench isolation (e.g., STI 402). In some aspects, the two non-insulative regions 310 coupled to the control terminals can be merged by removing the STI 402. In certain aspects, the non-insulative region 304 can be extended to the C2 region (e.g. as shown in FIGS. 3 and 4) or the non-insulative region 304 can be stopped short (e.g. as shown in FIG. 6). In some cases, different bias voltages may be applied to the first and second control terminals (CTRL1 and CTRL2). In some cases, the same bias voltage may be applied to the first and second control terminals via high impedance paths.

Figure 8:
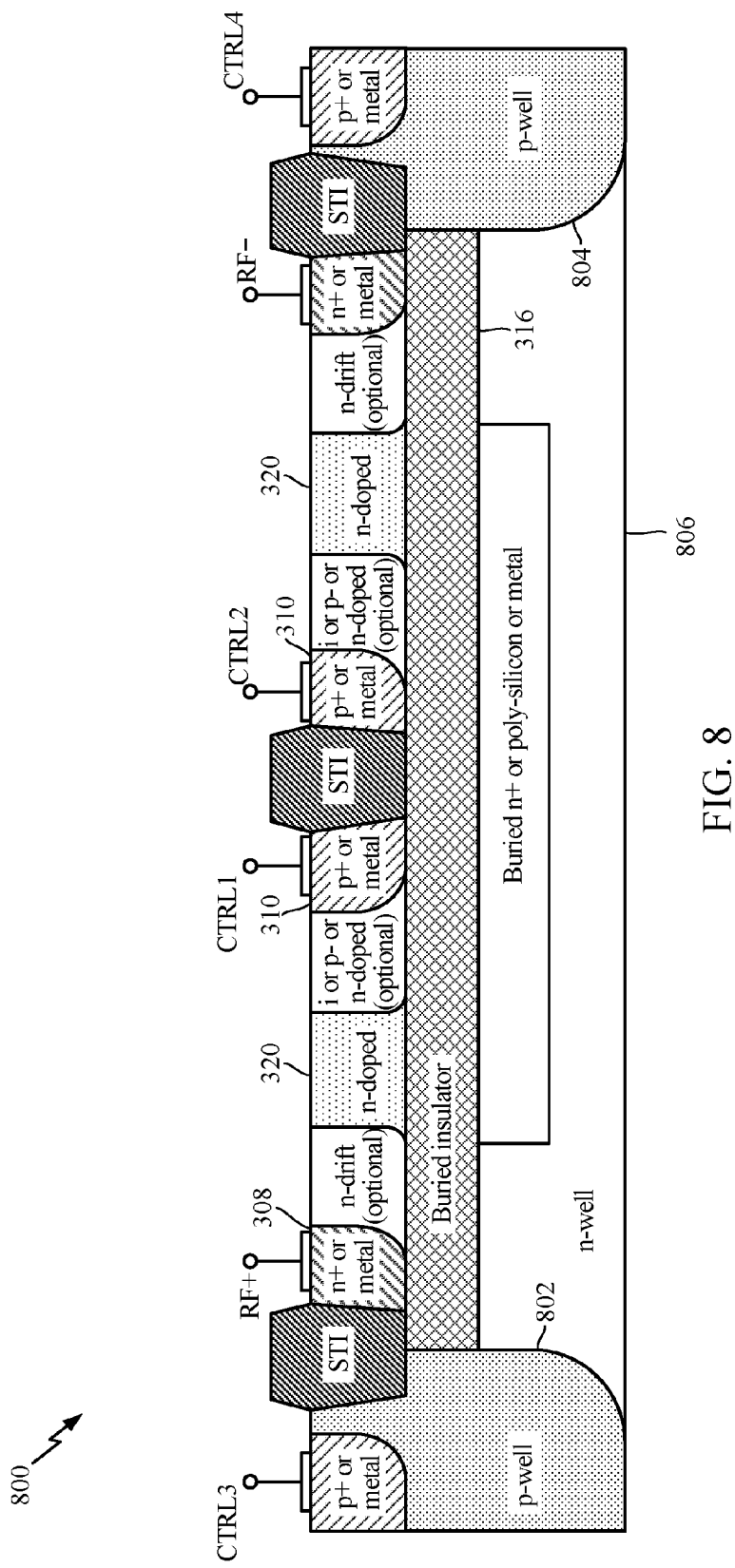
FIG. 8 illustrates an example differential semiconductor variable capacitor using a buried insulator for isolation and including additional control regions, in accordance with certain aspects of the present disclosure.

FIG. 8 illustrates an example differential transcap device 800 using a buried insulator 316 for isolation and including additional non-insulative regions for control terminals, in accordance with certain aspects of the present disclosure. In this case, additional diffusion regions 802 and 804 may be used as additional non-insulative regions for control terminals to adjust (e.g., reduce) the value of the capacitance of the transcap device. For example, the adjacent diffusion regions 802 and 804 may be biased in such a way as to deplete respective regions of the semiconductor region 806 below the RF+/RF− terminals, and thus, adjust the capacitance of the transcap device 800. Additional heavily doped and deep diffusion regions 802 and 804 may help achieve this objective with a reduced bias voltage.

Figure 9:
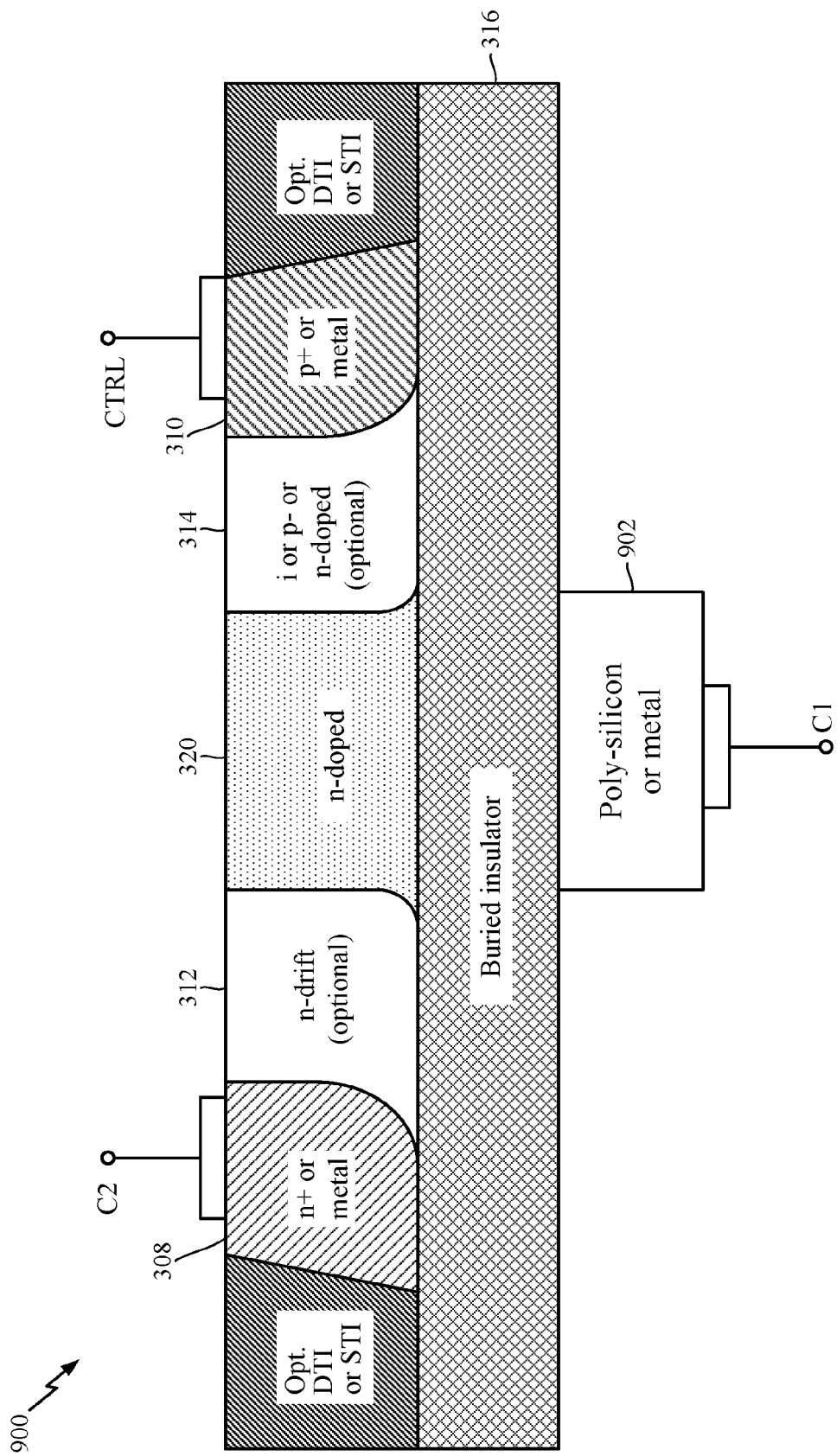
FIG. 9 illustrates an example semiconductor variable capacitor having a capacitance plate coupled to a bottom side of the buried insulator, in accordance with certain aspects of the present disclosure.

FIG. 9 illustrates an example transcap device 900 having a capacitance plate coupled to a bottom side of the buried insulator 316, in accordance with certain aspects of the present disclosure. As illustrated, the C1 terminal may be disposed on the opposite end of the buried insulator 316 from the semiconductor region 320. For example, the C1 terminal may be coupled to a non-insulative region 902 (e.g., poly-silicon or metal). As illustrated, the buried insulator 316 may be disposed between the non-insulative region 902 and the regions 312 and 314 such that the non-insulative region 902 is isolated from the regions 312 and 314.

Figure 10:
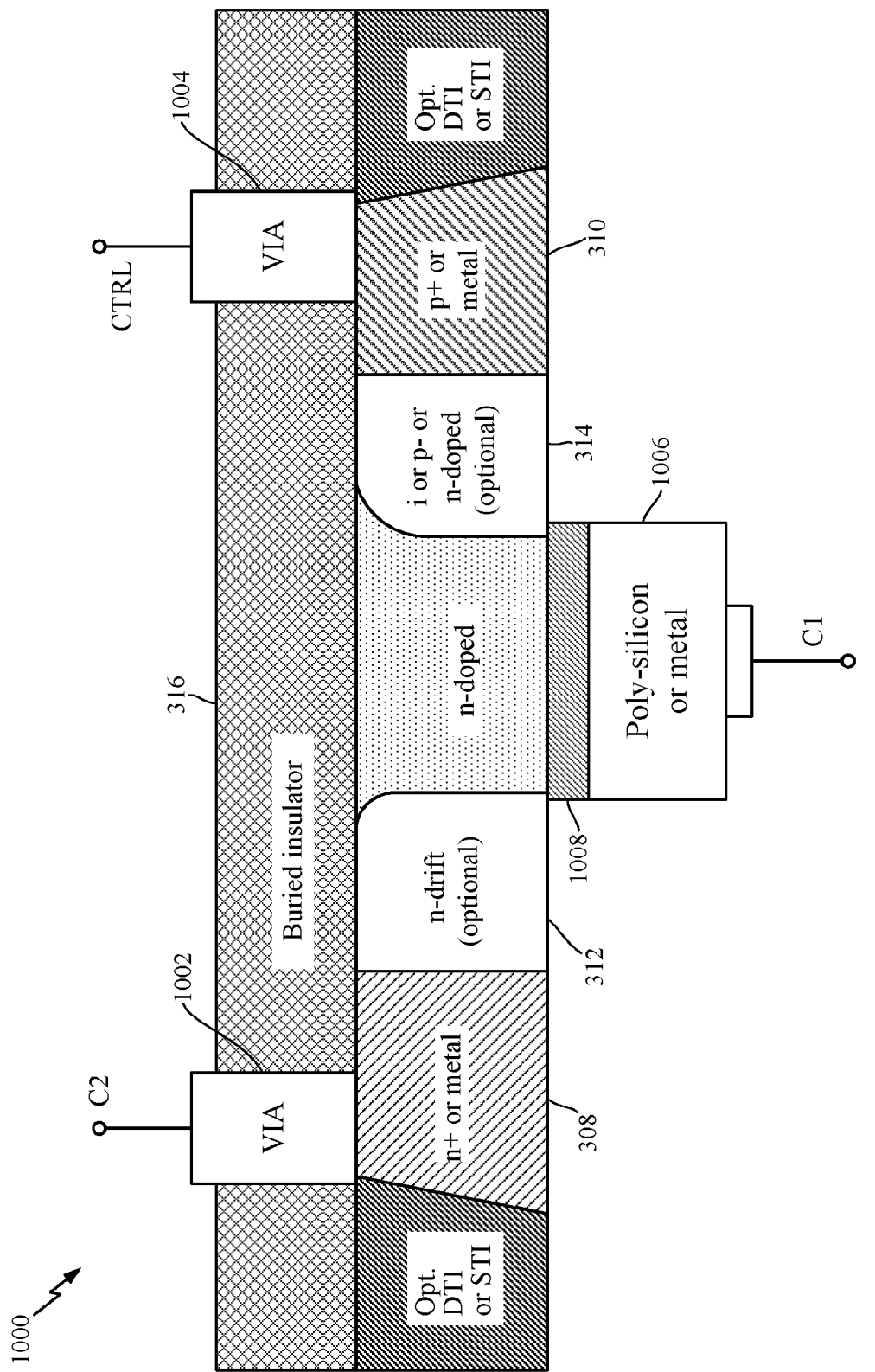
FIG. 10 illustrates an example semiconductor variable capacitor having vias for connecting capacitance and control plates to a semiconductor region of the transcap device, in accordance with certain aspects of the present disclosure.

FIG. 10 illustrates an example transcap device 1000 having vias for coupling the C2 terminal and the control terminal to the semiconductor region 320, in accordance with certain aspects of the present disclosure. In this case, the C2 terminal and the control terminal may be disposed on an opposite side of the buried insulator 316 with respect to the non-insulative regions 308 and 310. For example, the C2 terminal and the control terminal may be disposed on a first side of the buried insulator 316, and the non-insulative regions 308 and 310 may be coupled to a second side of the buried insulator 316. In this case, the C2 terminal and control terminal may be coupled to the non-insulative regions 308 and 310 with vias 1002 and 1004, respectively. The C1 terminal may be coupled to a non-insulative region 1006 (e.g., poly-silicon or metal), which may be isolated from the non-insulative regions 308 and 310 by a gate oxide layer 1008, as illustrated.

Figure 11:
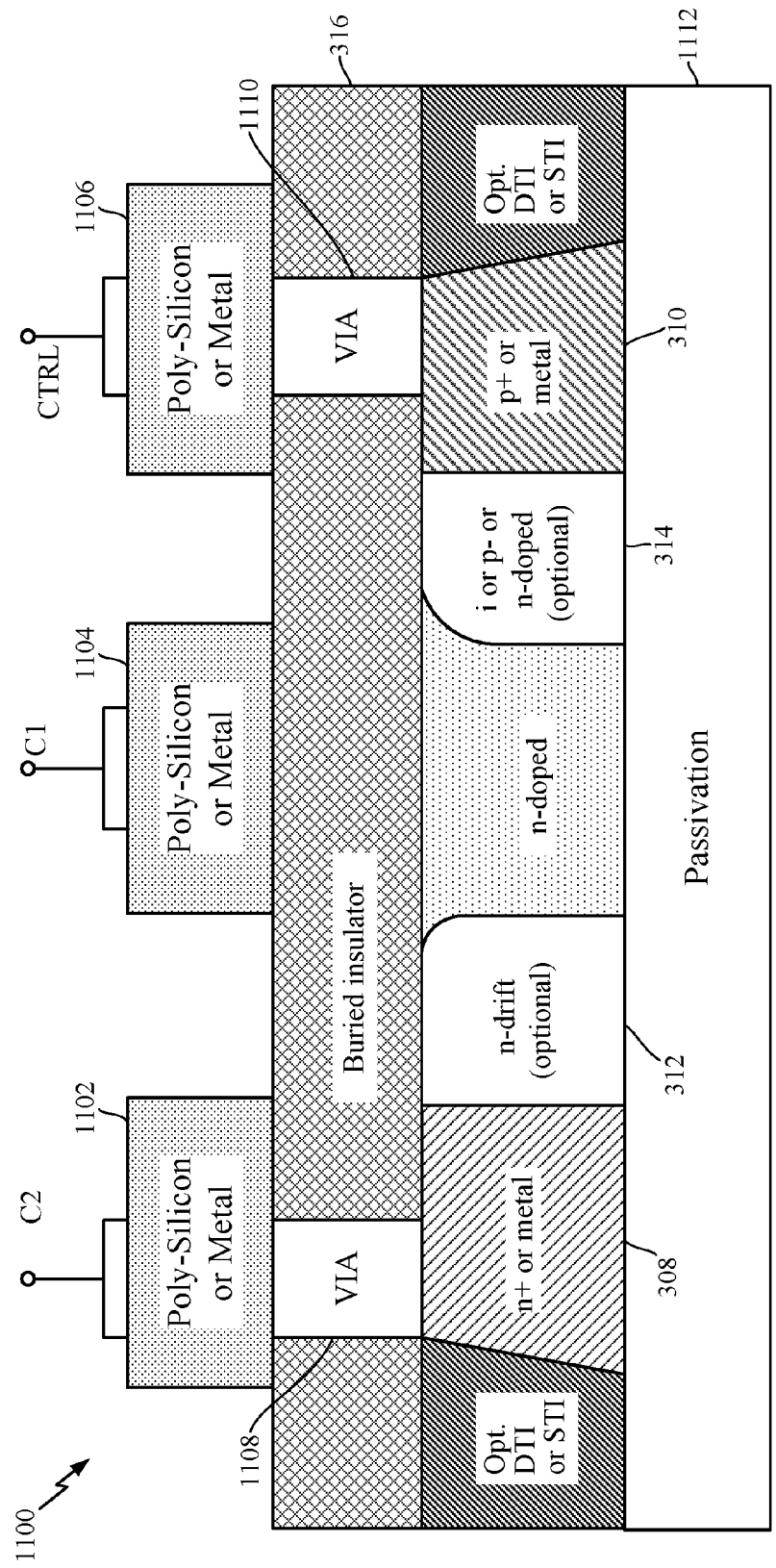
FIG. 11 illustrates an example semiconductor variable capacitor with capacitance plates coupled to opposite sides of a buried insulator, in accordance with certain aspects of the present disclosure.

FIG. 11 illustrates an example transcap device 1100, in accordance with certain aspects of the present disclosure. As illustrated, the non-insulative regions 308 and 310 may be disposed on an opposite side of the buried insulator 316 with respect to the C1, C2, and control terminals. For example, each of the C1, C2, and control terminals may be coupled to non-insulative regions 1102, 1104, and 1006. In certain aspects, the C1 and control terminals may be coupled to respective non-insulative regions 308 and 310 using respective vias 1108 and 1110. Thus, non-insulative regions 308 and 1102 may be isolated from the C1 terminal (non-insulative region 1104) by the buried insulator 316. In certain aspects, the non-insulative regions 308 and 310 may be coupled to a passivation layer 1112.

Figure 12:
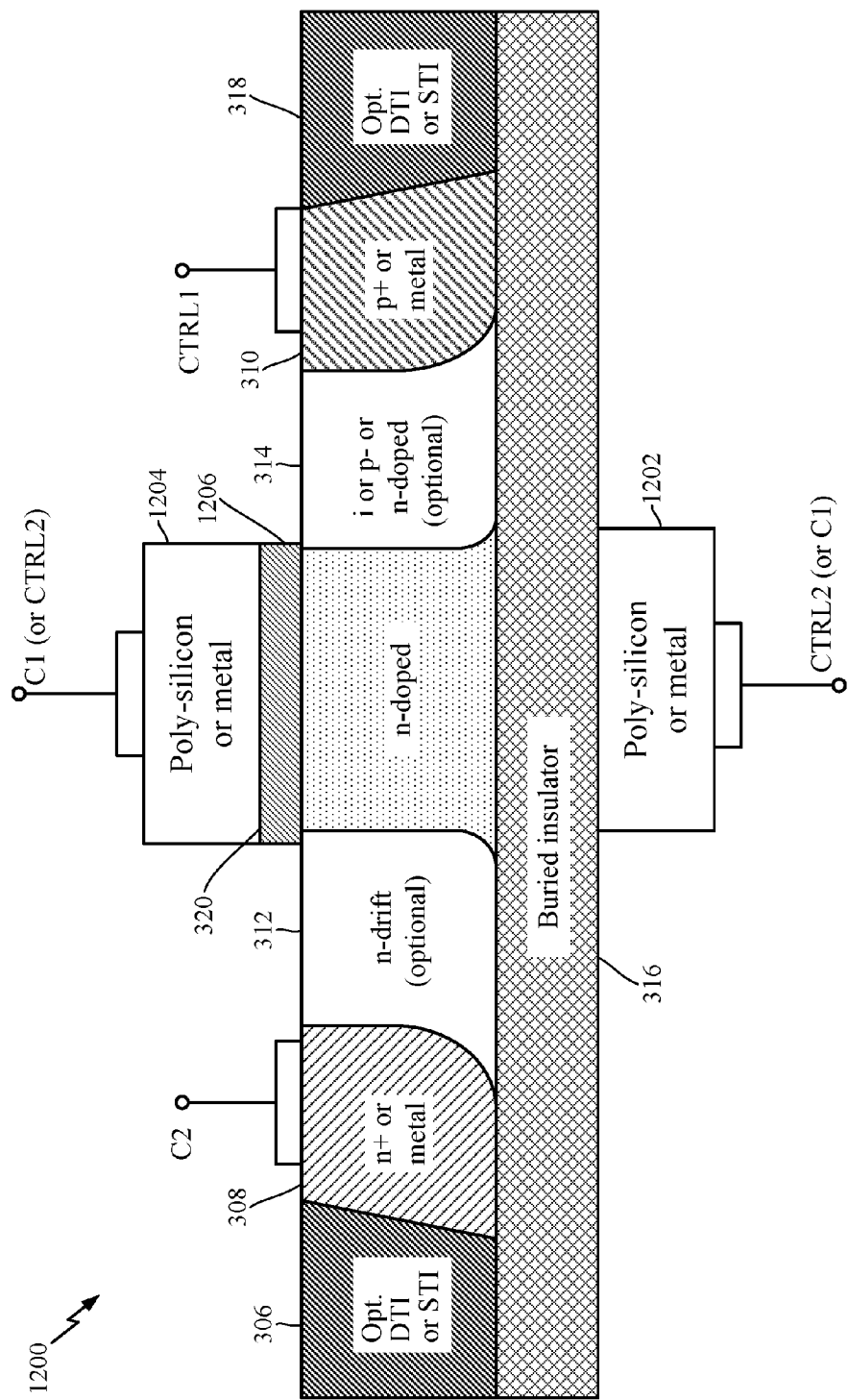
FIG. 12 illustrates an example semiconductor variable capacitor with multiple control terminals, in accordance with certain aspects of the present disclosure.

FIG. 12 illustrates an example transcap device 1200, in accordance with certain aspects of the present disclosure. The example transcap device 1200 may include two separate control terminals (CTRL1 and CTRL2) that can be used to adjust the capacitance between the C1 and C2 terminals. In certain aspects, the second control terminal may be used to modify the capacitance-voltage (C-V) characteristic of the transcap device 1200. In some aspects, the second control terminal may be used as a field plate. For example, the second control terminal may be shorted with one of the other terminals, e.g., the C2 terminal or the first control terminal (CTRL1), to reduce the electric field intensity in the semiconductor region 320. In this case, the non-insulative region that is used as a field plate can be extended to cover only a portion of the semiconductor region (e.g., may not be formed to extend from the region 312 to the non-insulative region 310). In general, both non-insulative regions 1202 and 1204 can be formed to extend from the non-insulative region 308 (or region 312) to the non-insulative region 310 or not, depending on the particular application. In certain aspects, non-insulative region 1204 may be separated from the semiconductor region 320 via an insulative region 1206 (e.g., an oxide layer). As illustrated, the non-insulative region 1204 may be used for (e.g., coupled to) the C1 terminal, and the non-insulative region 1202 may be used for (e.g., coupled to) the second control terminal, or vice versa.

A p-type version of the transcap devices of FIGS. 3-12 can be obtained by replacing the n-doped regions with p-doped regions and vice versa. Furthermore, independently from the conductivity type of the device, the buried region can be p-doped or n-doped, based on the desired performance and the process characteristics. Certain aspects of the present disclosure can be implemented using different technologies such as bulk, silicon on insulator (SOI), silicon on sapphire, III-V technology with or without hetero-junctions, or thin-film transistor (TFT). Moreover, multiple transcap devices as described herein may be stacked on top of each other.

Figure 13:
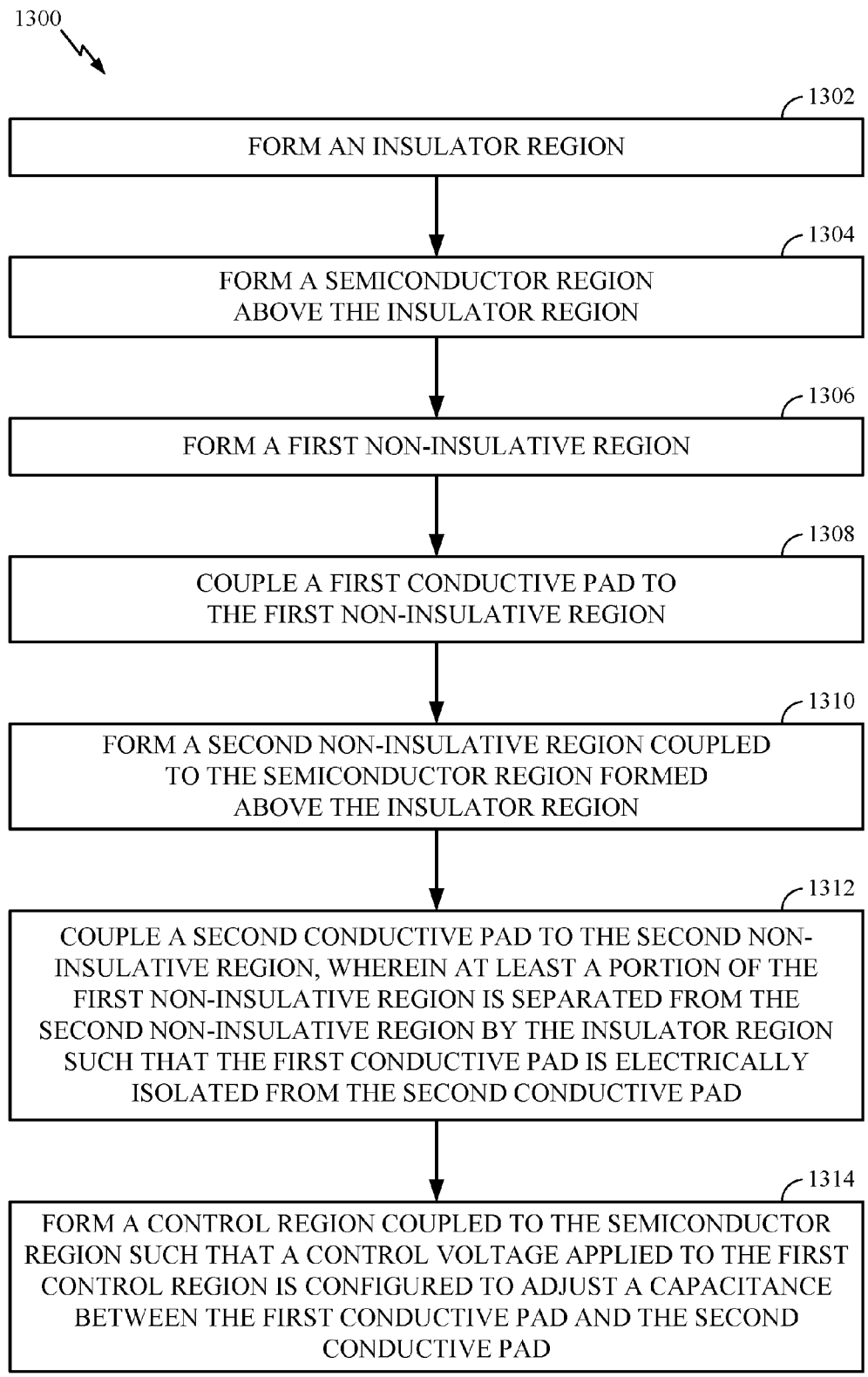
FIG. 13 is a flow diagram of example operations for fabricating a semiconductor variable capacitor, in accordance with certain aspects of the present disclosure.

FIG. 13 illustrates example operations 1300 for fabricating a semiconductor variable capacitor, in accordance with certain aspects of the presented disclosure. The operations 1300 may be performed, for example, by a semiconductor processing chamber.

Operations 1300 may begin at 1302 by forming a first insulator region (e.g., buried insulator 316). At 1304, a first semiconductor region (e.g., semiconductor region 320) may be formed above the first insulator region. At 1306, a first non-insulative region (e.g., non-insulative region 302) may be formed, and at 1308, a first conductive pad (e.g., C1 terminal) may be coupled to the first non-insulative region. At 1310, the operations 1300 include forming a second non-insulative region (e.g., non-insulative region 308) coupled to the first semiconductor region formed above the first insulator region. At 1312, a second conductive pad (e.g., C2 terminal) may be coupled to the second non-insulative region, wherein at least a portion (e.g., non-insulative region 304) of the first non-insulative region is separated from the second non-insulative region by the first insulator region such that the first conductive pad is electrically isolated from the second conductive pad. At 1314, the operations 1300 continue by forming a first control region coupled to the first semiconductor region such that a control voltage applied to the first control region is configured to adjust a capacitance between the first conductive pad and the second conductive pad.

In certain aspects, the at least the portion of the first non-insulative region comprises a second semiconductor region (e.g., non-insulative region 304) and forming the first non-insulative region comprises forming the second semiconductor region below the first insulator region, wherein the second semiconductor region and the second non-insulative region are electrically isolated by the first insulator region.

In certain aspects, a third non-insulative region (e.g., non-insulative region 302 of transcap 604) may be formed, and a third conductive pad (e.g., RF- terminal of FIG. 6) may be coupled to the third non-insulative region. In certain aspects, a second semiconductor region may be formed. In this case, the operations 1300 may include forming a second control region (e.g., non-insulative region 310 of transcap device 604) coupled to the second semiconductor region such that a capacitance between the second conductive pad and the third conductive pad is adjusted by varying a control voltage applied to the second control region. In certain aspects, the third non-insulative region is coupled to the second semiconductor region.

In some aspects, the operations 1300 also include forming a second insulator region (e.g., buried insulator 316 of transcap device 604) below the second semiconductor region, wherein at least a portion (e.g., non-insulative region 304 of transcap device 604) of the third non-insulative region is electrically isolated from the second non-insulative region by the second insulator region. In certain aspects, forming the third non-insulative region comprises forming the third non-insulative region such that the portion of the third non-insulative region is disposed below the second insulator region, wherein the portion of the third non-insulative region and the second non-insulative region are electrically isolated by the second insulator region. In some cases, the first insulator region and the second insulator region are separate regions.

In certain aspects, the operations 1300 include forming a fourth non-insulative region (e.g., non-insulative region 308 of transcap device 604) and coupling a fourth conductive pad to the fourth non-insulative region, wherein the fourth non-insulative region is coupled to the second semiconductor region, wherein the second conductive pad is coupled to the fourth conductive pad. In certain aspects, a trench may be formed between the fourth non-insulative region and the second non-insulative region. In certain aspects, the second control region is coupled to the first control region. In some cases, a trench is formed between the second control region and the first control region.

In certain aspects, a trench is formed between the first non-insulative region and the second non-insulative region. In some cases, the first insulator region comprises a buried oxide layer of the semiconductor variable capacitor. In certain aspects, at least one of the first non-insulative region, the second non-insulative region, or the first control region comprises metal.

In certain aspects, the first non-insulative region and the first semiconductor region are formed on opposite sides of the first insulator region. In this case, the operations 1300 may also include forming a second insulator region (e.g., insulator region 1206) coupled to the first semiconductor region, and forming a second control region (e.g., non-insulative region 1204) coupled to the second insulator region, such that another control voltage applied to the second control region is configured to adjust the capacitance between the first conductive pad and the second conductive pad.

In certain aspects, the operations 1300 also include coupling the second non-insulative region to the first semiconductor region by a via through the first insulator region. In certain aspects, the first control region may be coupled to the first semiconductor region by a via through the first insulator region.

Figure 14:
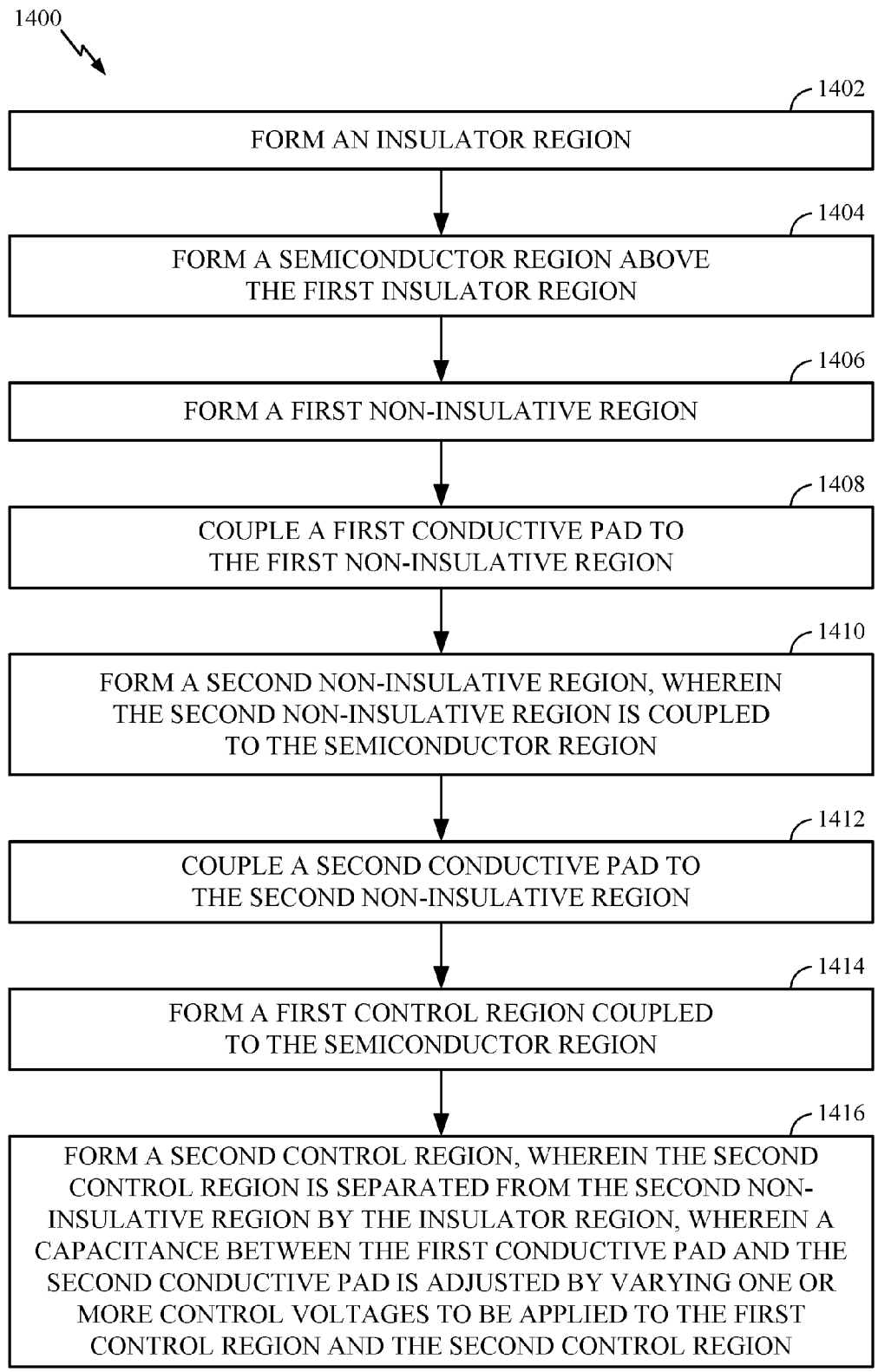
FIG. 14 is a flow diagram of example operations for fabricating a semiconductor variable capacitor with multiple control terminals, in accordance with certain aspects of the present disclosure.

FIG. 14 illustrates example operations 1400 for fabricating a semiconductor variable capacitor, in accordance with certain aspects of the presented disclosure. The operations 1400 may be performed, for example, by a semiconductor processing chamber.

Operations 1400 may begin at 1402 by forming an insulator region (e.g., buried insulator 316), and at 1404, forming a semiconductor region (e.g., semiconductor region 320) above the insulator region. At 1406, a first non-insulative region (e.g., non-insulative region 1204 of FIG. 12) may be formed, and at 1408, a first conductive pad (e.g., C2 terminal) may be coupled to the first non-insulative region. At 1410, a second non-insulative region (e.g., non-insulative region 308) may be formed, and at 1412, a second conductive pad (e.g., C2 terminal) may be coupled to the second non-insulative region. In certain aspects, the second non-insulative region is coupled to the semiconductor region. The operations 1400 continue at 1414 by forming a first control region coupled to the semiconductor region, and at 1416, forming a second control region. The second control region may be separated from the second non-insulative region by the insulator region such that one or more control voltages applied to the first control region and the second control region are configured to adjust a capacitance between the first conductive pad and the second conductive pad.

In certain aspects, the second control region and the semiconductor region are formed on opposite sides of the insulator region. In some cases, the insulator region comprises a buried oxide layer of the semiconductor variable capacitor. In certain aspects, at least one of the first non-insulative region, the second non-insulative region, the first control region, or the second control region comprises metal.

The various operations of methods described above may be performed by any suitable means capable of performing the corresponding functions. The means may include various hardware and/or software component(s) and/or module (s), including, but not limited to a circuit, an application-specific integrated circuit (ASIC), or processor. Generally, where there are operations illustrated in figures, those operations may have corresponding counterpart means-plus-function components with similar numbering.

As used herein, the term "determining" encompasses a wide variety of actions. For example, "determining" may include calculating, computing, processing, deriving, investigating, looking up (e.g., looking up in a table, a database, or another data structure), ascertaining, and the like. Also, "determining" may include receiving (e.g., receiving information), accessing (e.g., accessing data in a memory), and the like. Also, "determining" may include resolving, selecting, choosing, establishing, and the like.

As used herein, a phrase referring to "at least one of" a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The various illustrative logical blocks, modules and circuits described in connection with the present disclosure may be implemented or performed with a general purpose processor, a digital signal processor (DSP), an ASIC, a field programmable gate array (FPGA) or other programmable logic device (PLD), discrete gate or transistor logic, discrete hardware components, or any combination thereof designed to perform the functions described herein. A general-purpose processor may be a microprocessor, but in the alternative, the processor may be any commercially available processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

The functions described may be implemented in hardware, software, firmware, or any combination thereof. If implemented in hardware, an example hardware configuration may comprise a processing system in a wireless node. The processing system may be implemented with a bus architecture. The bus may include any number of interconnecting buses and bridges depending on the specific application of the processing system and the overall design constraints. The bus may link together various circuits including a processor, machine-readable media, and a bus interface. The bus interface may be used to connect a network adapter, among other things, to the processing system via the bus. The network adapter may be used to implement the signal processing functions of the physical (PHY) layer. In the case of a user terminal, a user interface (e.g., keypad, display, mouse, joystick, etc.) may also be connected to the bus. The bus may also link various other circuits such as timing sources, peripherals, voltage regulators, power management circuits, and the like, which are well known in the art, and therefore, will not be described any further.

The processing system may be configured as a general-purpose processing system with one or more microprocessors providing the processor functionality and external memory providing at least a portion of the machine-readable media, all linked together with other supporting circuitry through an external bus architecture. Alternatively, the processing system may be implemented with an ASIC with the processor, the bus interface, the user interface in the case of an access terminal), supporting circuitry, and at least a portion of the machine-readable media integrated into a single chip, or with one or more FPGAs, PLDs, controllers, state machines, gated logic, discrete hardware components, or any other suitable circuitry, or any combination of circuits that can perform the various functionality described throughout this disclosure. Those skilled in the art will recognize how best to implement the described functionality for the processing system depending on the particular application and the overall design constraints imposed on the overall system.

It is to be understood that the claims are not limited to the precise configuration and components illustrated above. Various modifications, changes and variations may be made in the arrangement, operation and details of the methods and apparatus described above without departing from the scope of the claims.

What is claimed is:

1. A semiconductor variable capacitor comprising:
   a substrate;
   a first conductive pad coupled to a first non-insulative region;
   a second conductive pad coupled to a second non-insulative region, wherein the second non-insulative region is coupled to a first semiconductor region;
   a first control region coupled to the first semiconductor region such that a capacitance between the first conductive pad and the second conductive pad is configured to be adjusted by varying a control voltage applied to the first control region; and
   a first insulator region between the first semiconductor region and the substrate with respect to an axis perpendicular to the substrate, wherein at least a portion of the first non-insulative region is separated from the first semiconductor region by the first insulator region such that the first conductive pad is electrically isolated from the second conductive pad.

2. The capacitor of claim 1, wherein the capacitance between the first conductive pad and the second conductive pad is configured to be adjusted by varying the control voltage applied to the first control region with respect to the second conductive pad.

3. The capacitor of claim 1, wherein the at least the portion of the first non-insulative region comprises a second semiconductor region, wherein the first insulator region is between the first semiconductor region and the second semiconductor region, wherein the second semiconductor region and the second non-insulative region are electrically isolated by the first insulator region.

4. The capacitor of claim 1, further comprising:
   a third conductive pad coupled to a third non-insulative region; and
   a second control region coupled to a second semiconductor region such that a capacitance between the second conductive pad and the third conductive pad is configured to be adjusted by varying a control voltage applied to the second control region.

5. The capacitor of claim 4, wherein the third non-insulative region is coupled to the second semiconductor region.

6. The capacitor of claim 4, further comprising:
   a second insulator region disposed below the second semiconductor region, wherein at least a portion of the third non-insulative region is electrically isolated from the second non-insulative region by the second insulator region.

7. The capacitor of claim 6, wherein the portion of the third non-insulative region comprises a third semiconductor region disposed below the second insulator region, wherein the third semiconductor region and the second non-insulative region are electrically isolated by the second insulator region.

8. The capacitor of claim 6, wherein the first insulator region and the second insulator region are separate regions.

9. The capacitor of claim 4, further comprising a fourth conductive pad coupled to a fourth non-insulative region, wherein the fourth non-insulative region is coupled to the second semiconductor region, wherein the second conductive pad is coupled to the fourth conductive pad.

10. The capacitor of claim 9, wherein the fourth non-insulative region is a separate region than the second non-insulative region and separated via trench isolation.

11. The capacitor of claim 4, wherein the second control region is coupled to the first control region.

12. The capacitor of claim 1, wherein the first non-insulative region and the second non-insulative region are separated via trench isolation.

13. The capacitor of claim 1, wherein the first non-insulative region and the first semiconductor region are disposed on opposite sides of the first insulator region.

14. The capacitor of claim 13, further comprising a second control region coupled to a second insulator region, wherein the second insulator region is coupled to the first semiconductor region such that a capacitance between the first conductive pad and the second conductive pad is configured to be adjusted by varying another control voltage applied to the second control region.

15. The capacitor of claim 1, wherein the second non-insulative region is coupled to the first semiconductor region by a via through the first insulator region.

16. The capacitor of claim 1, wherein the first control region is coupled to the first semiconductor region by a via through the first insulator region.

17. The capacitor of claim 1, wherein the first insulator region is between the first control region and the at least the portion of the first non-insulative region with respect to the axis perpendicular to the substrate.

18. A method for fabricating a semiconductor variable capacitor, comprising:
    forming an insulator region;
    forming a semiconductor region above the insulator region, wherein the insulator region is formed between the semiconductor region and a substrate with respect to an axis perpendicular to the substrate;
    forming a first non-insulative region;
    coupling a first conductive pad to the first non-insulative region;
    forming a second non-insulative region coupled to the semiconductor region formed above the insulator region;
    coupling a second conductive pad to the second non-insulative region, wherein at least a portion of the first non-insulative region is separated from the semiconductor region by the insulator region such that the first conductive pad is electrically isolated from the second conductive pad; and
    forming a control region coupled to the semiconductor region such that a control voltage applied to the control region is configured to adjust a capacitance between the first conductive pad and the second conductive pad.

* * * * *